(12) United States Patent
Chen et al.

(10) Patent No.: US 9,431,317 B2
(45) Date of Patent: Aug. 30, 2016

(54) POWER DOUBLER AMPLIFIER MODULE WITH IMPROVED SOLDER COVERAGE BETWEEN A HEAT SINK AND A THERMAL PAD OF A CIRCUIT PACKAGE

(71) Applicant: Cisco Technology, Inc., San Jose, CA (US)

(72) Inventors: Yongguo Chen, Shanghai (CN); Hujiao Wang, Shanghai (CN); David A. Holtzclaw, Cumming, GA (US); Wei Qi, Shanghai (CN); Benjamin Lee Davis, Lawrenceville, GA (US); John MacKay, Lawrenceville, GA (US)

(73) Assignee: Cisco Technology, Inc., San Jose, CA (US)

( * ) Notice: Subject to any disclaimer, the term of this patent is extended or adjusted under 35 U.S.C. 154(b) by 117 days.

(21) Appl. No.: 14/074,057

(22) Filed: Nov. 7, 2013

(65) Prior Publication Data

US 2015/0124410 A1 May 7, 2015

(51) Int. Cl.
*H05K 7/20* (2006.01)
*H01L 23/367* (2006.01)
*H01L 23/13* (2006.01)
*H01L 23/40* (2006.01)
*H01L 23/42* (2006.01)

(52) U.S. Cl.
CPC ........... *H01L 23/3675* (2013.01); *H01L 23/13* (2013.01); *H01L 23/4006* (2013.01); *H01L 23/42* (2013.01); *H01L 2023/405* (2013.01); *H01L 2023/4068* (2013.01); *H01L 2924/0002* (2013.01)

(58) Field of Classification Search
CPC .......................... H01L 23/3675; H01L 23/367
See application file for complete search history.

(56) References Cited

U.S. PATENT DOCUMENTS

| | | | | |
|---|---|---|---|---|
| 4,521,827 A | * | 6/1985 | Jordan et al. | 361/704 |
| 6,049,125 A | * | 4/2000 | Brooks | H01L 23/36 257/712 |
| 7,190,581 B1 | * | 3/2007 | Hassani et al. | 361/699 |
| 7,724,528 B2 | * | 5/2010 | Mahoney | H01L 23/3677 165/104.33 |
| 8,277,597 B2 | * | 10/2012 | Yamamoto | 156/286 |
| 2002/0079570 A1 | * | 6/2002 | Ho | H01L 23/13 257/697 |
| 2002/0131240 A1 | * | 9/2002 | Kim | 361/719 |
| 2003/0111717 A1 | * | 6/2003 | Ito | H01L 21/4821 257/678 |
| 2003/0121564 A1 | * | 7/2003 | Taguchi | B23K 35/3618 148/25 |
| 2005/0168949 A1 | * | 8/2005 | Tilton | H01L 23/4735 361/699 |
| 2009/0052901 A1 | * | 2/2009 | Cagle | H04B 10/2504 398/116 |

* cited by examiner

*Primary Examiner* — Michael Lebentritt
*Assistant Examiner* — Jordan Klein
(74) *Attorney, Agent, or Firm* — Leon R. Turkevich; Edward J. Stemberger

(57) ABSTRACT

In one embodiment, an apparatus includes a printed circuit board, and a circuit package mounted to the printed circuit board. The circuit package has a thermal pad. A first heat sink structure of the module is associated with the printed circuit board and has a wall defining a contact surface that contacts and thermally couples with the thermal pad. The wall includes at least one aperture there-through. Solder paste is provided between the contact surface and the thermal pad to bond the contact surface to the thermal pad, with the at least one aperture being constructed and arranged to aid in outgassing of the solder paste.

15 Claims, 2 Drawing Sheets

POWER DOUBLER AMPLIFIER MODULE WITH IMPROVED SOLDER COVERAGE BETWEEN A HEAT SINK AND A THERMAL PAD OF A CIRCUIT PACKAGE

TECHNICAL FIELD

The present disclosure generally relates to heat dissipation assemblies and more particularly to heat sink assemblies for cable television line amplifiers.

BACKGROUND

A Power Doubler amplifier has been employed in high performance cable television distribution systems. This module has high output capability and provides excellent linearity and superior return loss performance with low noise and optimal reliability. However, if the amplifier includes a surface mounted circuit package, it is difficult to obtain adequate solder coverage between the circuit package and a heat sink structure.

BRIEF DESCRIPTION OF THE DRAWINGS

Reference is made to the attached drawings, wherein elements having the same reference numeral designations represent like elements throughout and wherein.

DESCRIPTION OF EXAMPLE EMBODIMENTS

Overview

Figure 1:
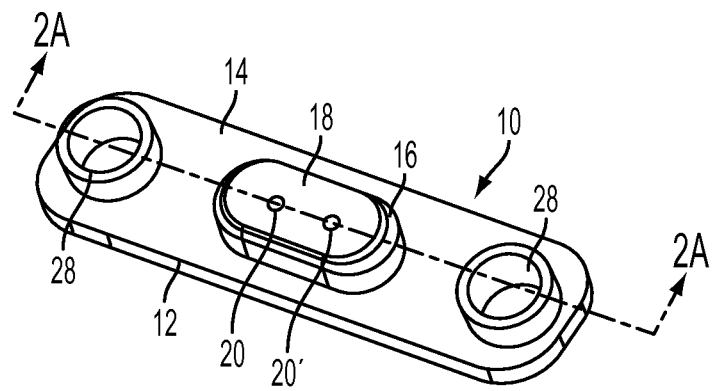
FIG. 1 is perspective view of an example heat sink structure provided in accordance with an example embodiment.

In one embodiment, an apparatus includes a printed circuit board and a circuit package mounted to the printed circuit board. The circuit package has a thermal pad. A first heat sink structure of the module is associated with the printed circuit board and has a wall defining a contact surface that contacts and thermally couples with the thermal pad. The wall includes at least one aperture there-through. Solder paste is provided between the contact surface and the thermal pad to bond the contact surface to the thermal pad, with the at least one aperture being constructed and arranged to aid in outgassing of the solder paste.

In another embodiment, an apparatus has a printed circuit board and a circuit package surface mounted to the printed circuit board. The circuit package has a thermal pad. A heat sink structure carries the printed circuit board and has a protrusion extending through the printed circuit board. The protrusion has a wall defining a contact surface that contacts and thermally couples with the thermal pad. The wall includes at least one aperture there-through. Solder paste is provided between the contact surface and the thermal pad to bond the contact surface to the thermal pad, with the at least one aperture being constructed and arranged to aid in outgas sing of the solder paste.

In yet another embodiment, a method is provided for bonding a circuit package to a first heat sink structure of a module. The module includes a printed circuit board, the circuit package mounted to the printed circuit board, with the circuit package having a thermal pad, and the first heat sink structure associated with the printed circuit board having a wall defining a contact surface that contacts and thermally couples with the thermal pad. At least one aperture is defined through the wall. The contact surface is bonded to the thermal pad using solder paste, with the at least one aperture aiding in outgas sing of the solder paste.

Detailed Description

Particular embodiments provide for cooling of a circuit package of an amplifier module along with more effective soldering of the circuit package's internal pad to a heat sink structure. In particular, U.S. Pat. No. 7,724,528 B2 discloses improved cooling of a conventional circuit package with an internal thermal pad by using a copper heat sink or slug that replaces the thermal vias underneath the circuit package. However, the heat slug of U.S. Pat. No. 7,724,528 B2 may not adequately dissipate the heat of a newer-type circuit package having a power density over about 17 W/cm$^2$. The newer circuit package was found to overheat by around 3° C. Using the conventional heat slug is also inadequate because the newer, surface mounted circuit package is very flat on the bottom layer and soldering of circuit package to the copper heat slug is difficult since a consistent soldering with good coverage cannot be assured. However, effective soldering of the newer circuit package's internal pad to the copper heat slug is required for good thermal dissipation.

Figure 2A:
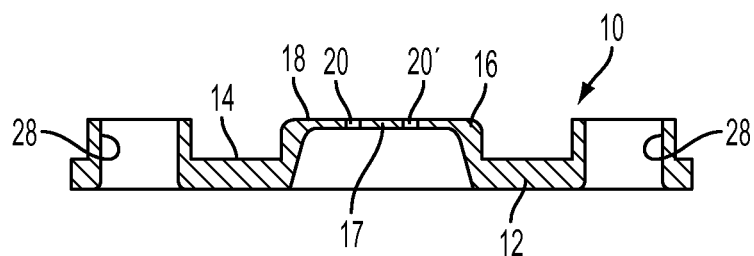
FIG. 2A is a sectional view of the heat sink structure taken along the line 2A-2A of FIG. 1.
Figure 2B:
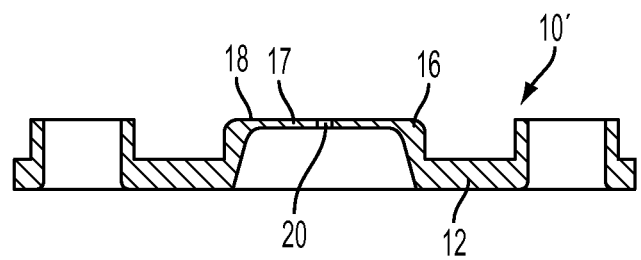
FIG. 2B is a sectional view of the heat sink structure of another example embodiment.

With reference to FIGS. 1 and 2A, a heat sink structure is shown, generally indicated at 10, in accordance with an example embodiment. The heat sink structure 10 includes a thermally conductive body 12 having a generally planar top surface 14. The body 12 is preferably made of copper alloy but can be made of any material with good heat transfer properties. The heat sink structure 10 preferably also has a generally central protrusion 16 having an upper wall 17 with a generally planar contact surface 18. At least one aperture is provided through the upper wall 17. In the embodiment of FIG. 2A, a first aperture 20 and a second aperture 20' are provided through the upper wall 17, the function of which will be explained below. The apertures 20, 20' may be of the same or different size and are preferably drilled through the upper wall 17. The apertures 20, 20'are made as small as possible, but easy to manufacture. FIG. 2B shows another embodiment of the heat sink structure 10', with the upper wall 17 having only a single aperture 20, located generally centrally of the protrusion 16.

Figure 3:
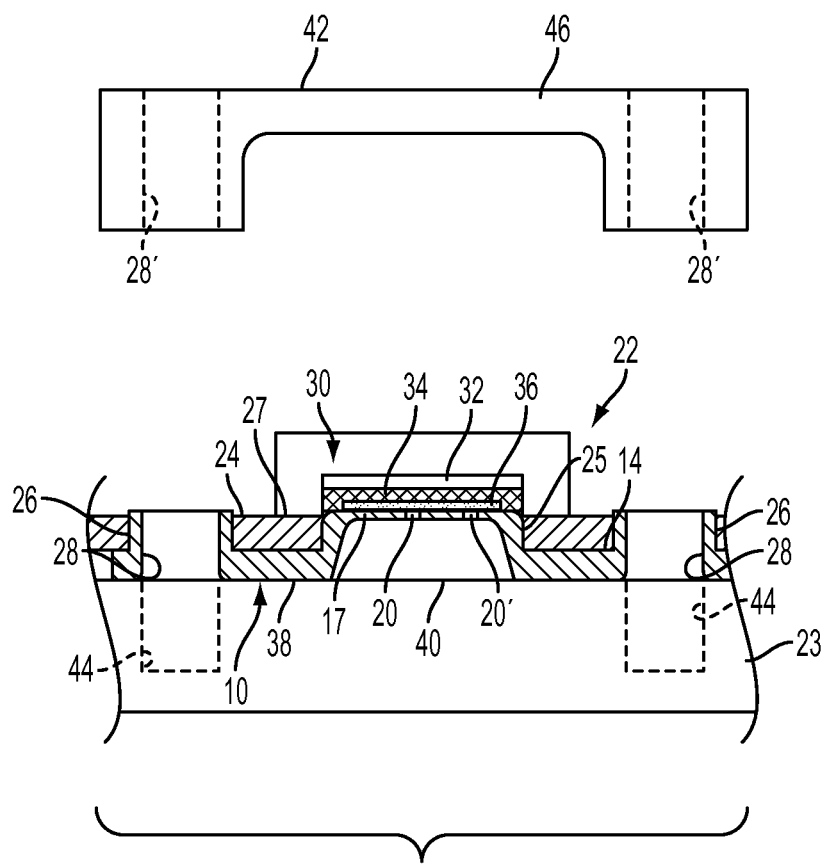
FIG. 3 is a sectional view of an example amplifier module including the heat sink structure of FIG. 2A, a printed circuit board, and a circuit package, with the module shown mounted to a housing.

FIG. 3 shows a power doubler amplifier module, generally indicated at 22, employed in high performance cable television distribution systems and incorporating the heat sink structure 10 of FIG. 2A. The module 22 is preferably installed within a housing 23, such as a Community Access Television (CATV) node housing as disclosed in U.S. Pat. No. 7,724,528 B2, the entire content of which is hereby incorporated by reference into this specification. The planar top surface 14 of the heat sink structure 10 carries a printed circuit board (PCB) 24 of the module 22. The protrusion 16 extends through a main through hole 25 of the PCB 24. The PCB 24 may be a multilayer printed wiring board, such as one formed of a substrate made of epoxy-fiberglass or Flame Retardant 4 (FR4) or other material having copper cladding on its opposing surfaces. The copper cladding may be etched to leave desired circuit wiring, ground planes, etc. Bolt through holes 26 may be drilled in the PCB 26 to mate with bolt holes 28 in the heat sink structure 10.

A circuit package, generally indicated at 30, is mounted to the PCB 24 so as to be electrically coupled therewith (e.g., preferably by surface mount technology). The circuit package 30, for example, comprises a very small QFN (Quad Flatpack No lead) package with dimensional size of about 9.0 mm ×8.0 mm ×1.375 mm. Since the power consumption can be as high as 17.7 W/cm$^2$, cooling of this circuit package 30 is a challenge.

The circuit package 30 includes a heat dissipating circuit 32, such as a GaN FET amplifier integrated circuit used in a cable television line amplifier. The circuit package 30 further includes a flexible grounding and thermal pad 34, preferably formed from tin-plated copper or other thermally conductive material, integrally formed with the circuit package 30. The heat dissipating circuit 32 may be eutecticly bonded to a surface of the thermal pad 34 by brazing or soldering alloy with a melting temperature sufficiently above the temperature of lead-tin solder so that subsequent soldering operations do not remelt the bond. Although a QFN is disclosed, the circuit package 30 can be any integrated circuit that includes a thermal pad 34.

As shown in FIG. 3, the lower surface of the thermal pad 34 contacts the contact surface 18 of the heat sink structure 10 for directing heat away from the circuit package 30 and into the housing 23. As shown in FIG. 1, the contact surface 18 of the heat sink structure 10 preferably is shaped to correspond generally to shape of the exposed lower surface of the thermal pad 34 (and the PCB main through hole 25) to provide maximum contact there-between.

The protrusion 16 may be configured so that when the heat sink structure 10 receives the PCB 24 as shown in FIG. 3, the protrusion 16 extends upwardly through the through hole 25 of the PCB 24 beyond the surface 27 of the PCB 24 to contact the lower surface of the thermal pad 24. This establishes a thermal coupling between the thermal pad 34 and the protrusion 16 of the heat sink structure 10. The contact surface 18 of the heat sink structure 10 may be bonded to and thermally coupled to the lower surface of the thermal pad 24 by surface mounting, lead-free solder paste 36 (typically tin mixed together with flux).

The heat sink structure 10 may also be thermally coupled to the housing 23. For example, as seen in FIG. 3, the heat sink structure 10 may include a generally planar bottom surface 38 for contacting a planar surface 40 of the housing 23 to establish a thermal path between the heat sink structure 10 and the housing 23. A thermal flow path is thereby established from the thermal pad 34 of the circuit package 30, through the heat sink structure 10 and into the housing 23.

The provision of the aperture(s) 20 in the upper wall 17 of the heat sink structure 10 ensure more effective soldering of the thermal pad 34 of the circuit package 30 to the contact surface 18 and improves cooling of the circuit package 30. It has been found that the aperture(s) 20 aids in outgassing of the solder paste 36 during reflow. The location of the aperture(s) 20 can be adjusted according to the location of circuit package 30 internal heat source. A circuit package 30 was mounted on protrusion of a conventional heat sink structure (without the apertures 20) and compared to a circuit package 30 mounted on the protrusion 16 (having at least one aperture 20) of the embodiment. X-Ray analysis showed that the circuit package 30 with the innovative heat sink structure 10 (having at least one aperture 20) had good soldering with more than 85% solder coverage. Thermal testing showed the that temperature of the circuit package 30 with the heat sink structure 10 of the embodiment (having at least one aperture 20) was lower than that with the conventional heat sink structure (having no aperture) by 6° C.

The aperture(s) 20 is also useful in a reworking process. If the solder coverage is found to be insufficient between the thermal pad 34 and the contact surface 18, one can directed additional solder through the aperture 20 in an attempt to gain adequate solder coverage.

As shown in FIG. 3, a second or upper heat sink structure 42 can be provided to sandwich the circuit package 30 between the upper heat sink structure 42 and the first, or lower heat sink structure 10 by use of bolts (not shown) received in the bolt holes 28', in the manner disclosed in U.S. Pat. No. 7,724,528 B2. Bolt receiving structure 44 in the housing 23 can be threaded for receiving the bolts. It can be appreciated that if the thermal pad 34 of the circuit package 30 was provided to be adjacent to the upper heat sink structure 42, wall 46 thereof could include the at least one aperture 20.

While the example embodiments in the present disclosure have been described in connection with what is presently considered to be the best mode for carrying out the subject matter specified in the appended claims, it is to be understood that the example embodiments are only illustrative, and are not to restrict the subject matter specified in the appended claims.

What is claimed is:

1. An apparatus comprising:
    a printed circuit board;
    a circuit package comprising a QFN (Quad Flatpack No lead) package mounted to the printed circuit board, the circuit package having a thermal pad and having a power consumption as high as about 17.7 W/cm$^2$;
    a first heat sink structure associated with the printed circuit board and having a wall defining a contact surface that contacts and thermally couples with the thermal pad, the wall including at least one aperture there-through, and
    solder paste between the contact surface and the thermal pad to bond the contact surface to the thermal pad, with the at least one aperture being constructed and arranged to aid in outgassing of the solder paste,
    wherein the apparatus is a power doubler amplifier.

2. The apparatus of claim 1, wherein the first heat sink structure carries the printed circuit board and has a protrusion extending through the printed circuit board, the protrusion defining the wall.

3. The apparatus of claim 1, wherein the solder paste is lead-free and includes tin mixed with flux.

4. The apparatus of claim 1, wherein a single aperture is provided through the wall and located generally centrally of the protrusion.

5. The apparatus of claim 1, wherein two apertures are provided through the wall.

6. The apparatus of claim 5, wherein the apertures are sized to be of the same or of different size.

7. The apparatus of claim 1, wherein a dimensional size of the QFN package is about 9.0 mm ×8.0 mm ×1.37 mm.

8. The apparatus of claim 1, further comprising a second heat sink structure constructed and arranged to couple with the first heat structure to sandwich the circuit package there-between.

9. The apparatus of claim 1, wherein a shape of the contact surface corresponds generally to a shape of the thermal pad.

10. A method of bonding a circuit package to a first heat sink structure of a power doubler amplifier, the power doubler amplifier comprising a printed circuit board; the circuit package mounted to the printed circuit board, the circuit package having a thermal pad; and the first heat sink structure associated with the printed circuit board having a wall defining a contact surface that contacts and thermally couples with the thermal pad, the method comprising:

defining at least one aperture through the wall, and outgassing solder paste via the at least one aperture while bonding the contact surface to the thermal pad using solder paste, wherein the circuit package comprises a Quad Flatpack No lead (QFN) package having a power consumption as high as about 17.7 W/cm$^2$.

11. The method of claim 10, wherein a single aperture is provided through the wall and located generally centrally thereof.

12. The method of claim 10, wherein two apertures are provided through the wall.

13. The method of claim 12, wherein the apertures are sized to be of the same or of different size.

14. The method of claim 10, further comprising:

coupling a second heat sink structure with the first heat structure to sandwich the circuit package there-between.

15. An apparatus comprising:

a printed circuit board;

a circuit package comprising a QFN (Quad Flatpack No lead) package surface mounted to the printed circuit board, the circuit package having a thermal pad and having a power consumption as high as about 17.7 W/cm$^2$;

a heat sink structure carrying the printed circuit board and having a protrusion extending through the printed circuit board, the protrusion having a wall defining a contact surface that contacts and thermally couples with the thermal pad, the wall including at least one aperture there-through, and solder paste between the contact surface and the thermal pad to bond the contact surface to the thermal pad, with the at least one aperture being constructed and arranged to aid in outgassing of the solder paste, wherein the apparatus is a power doubler amplifier.

* * * * *